(12) United States Patent
Lee et al.

(10) Patent No.: US 7,190,626 B2
(45) Date of Patent: Mar. 13, 2007

(54) MEMORY SYSTEM WITH BIT-LINE DISCHARGING MECHANISM

(75) Inventors: Cheng-Hung Lee, Hukou (TW); Ching-Wei Wu, Hsin Chu (TW); Hung-Jen Liao, Hsin Chu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 54 days.

(21) Appl. No.: 11/128,846

(22) Filed: May 13, 2005

(65) Prior Publication Data

US 2006/0256635 A1 Nov. 16, 2006

(51) Int. Cl.
*G11C 7/00* (2006.01)
(52) U.S. Cl. .............. 365/203; 365/204; 365/205; 365/189.05
(58) Field of Classification Search .............. 365/203, 365/104, 205, 189.05, 204
See application file for complete search history.

(56) References Cited

U.S. PATENT DOCUMENTS

| | | |
|---|---|---|
| 7,085,184 B1* | 8/2006 | Walther et al. ............. 365/203 |
| 2006/0013041 A1* | 1/2006 | Lin ....................... 365/185.05 |

* cited by examiner

Primary Examiner—Huan Hoang
(74) Attorney, Agent, or Firm—K&L Gates

(57) ABSTRACT

A memory access method and a memory system are disclosed for shortening a memory cell access time. The memory system comprises one or more memory cells, at least one bit-line discharge subsystem having one or more discharge modules, each discharge module coupled to a bit-line connecting to one or more memory cells for discharging a voltage level of the bit-line upon a triggering of a discharge control signal, at least one sense amplifier coupled to the bit-line for determining data stored in a selected memory cell, at least one latch module for storing the determined data from the sense amplifier upon a triggering of a latch enable signal, wherein the discharge control signal is triggered prior to the triggering of the latch enable signal so that the voltage level of the bit-line is discharged for allowing an accelerated reading of the data.

18 Claims, 2 Drawing Sheets

MEMORY SYSTEM WITH BIT-LINE DISCHARGING MECHANISM

BACKGROUND

The present invention relates generally to integrated circuit designs, and more particularly to a system for discharging bit-lines of memory designs before for triggering a data storage to increase read speed.

Various types of memory devices are widely used in computing devices today. There are Read-only memory (ROM) devices as well as Read-Access memory (RAM) devices. ROM is typically used as a storage medium in computer devices. Since it cannot easily be written to, its main uses lie in the distribution of firmware, or software that is both very closely related to hardware and not likely to need frequent upgrading.

Conventional methods used for sensing the states of memory cells utilize a sense amplifier along with a latch. The sense amplifier senses the voltage from the charged bit-line to determine the state of a memory cell as the charged bit-line leaks to certain voltage levels that are predetermined for high and low states of memory cells. However, the time margin required for the charged bit-line to leak to the predetermined high state voltage level and low state voltage level can vary. Since the voltage level for a high state memory cell is much higher than the voltage level used for determining the low state memory cell, the time margin required for voltage to leak to voltage level of a low state memory cell is typically much higher. The read margin may suffer due to the large time margin required for voltage to leak to the predetermined voltage levels. Not having enough read margin can affect the yield and create reliability issues. Read access time for current ROM circuit design is also slow since bit-lines are never discharged before latching. This creates extra time delay slowing down the read process.

It is therefore desirable to have an improved circuit design that can provide reliable state detection without as much time delay.

SUMMARY

In view of the foregoing, this invention provides a memory access method and a memory system for shortening a memory cell access time.

In one embodiment, the memory system comprises one or more memory cells, at least one bit-line discharge subsystem having one or more discharge modules, each discharge module coupled to a bit-line connecting to one or more memory cells for discharging a voltage level of the bit-line upon a triggering of a discharge control signal, at least one sense amplifier coupled to the bit-line for determining data stored in a selected memory cell, at least one latch module for storing the determined data from the sense amplifier upon a triggering of a latch enable signal, wherein the discharge control signal is triggered prior to the triggering of the latch enable signal so that the voltage level of the bit-line is discharged for allowing an accelerated reading of the data.

The construction and method of operation of the invention, however, together with additional objects and advantages thereof will be best understood from the following description of specific embodiments when read in connection with the accompanying drawings.

DESCRIPTION

The following provides a detailed description of a system for discharging the bit-lines of a memory cell array before a latch module is enabled to record data for achieving better read speed and margins.

Figure 1:
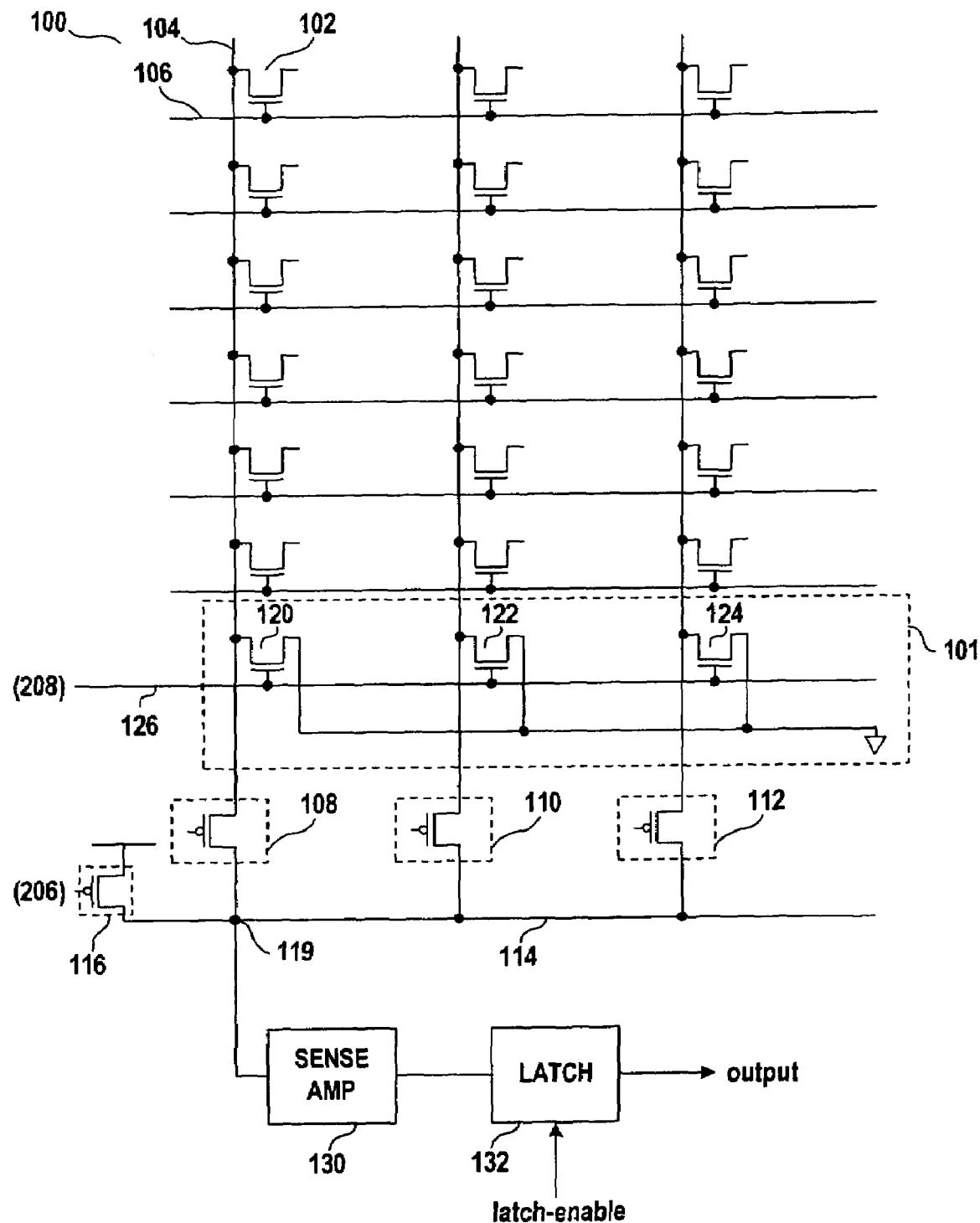
FIG. 1 presents a circuit diagram illustrating a memory design with a bit-line discharge subsystem in accordance with one embodiment of the present invention.

FIG. 1 presents a circuit diagram 100 illustrating a bit-line discharge mechanism or subsystem 101 that is implemented with an array of memory cells for improving read speed and margins of a ROM design in accordance with one embodiment of the present invention. As it is well known, an array of memory cells includes at least one memory cell, one bit-line, and one word-line. In this example, and for illustration purposes only, the array of memory cells has 18 memory cells 102 placed in a matrix formation of three columns and six rows. Each of these 18 memory cells 102 is tied to a bit-line 104 and a word-line 106 where the bit-lines will carry the column address of the memory cells and the word-lines will provide the row address of the memory cells.

For example, a memory cell 102 is selected when a bit-line 104 is charged and a high signal is applied on a word-line 106. Each bit-line is also respectively coupled to a selection module 108, 110, or 112, which is used as a switch to connect the corresponding bit-line to a signal-in line 114 when a memory cell coupled to that particular bit-line is to be programmed or read. Each of the coupled bit-line selection modules 108, 110, and 112 is typically controlled by a separate select signal, and the select signals can turn on a specific module 108, 110, or 112 to provide the necessary current for the corresponding bit-line. The selection modules 108, 110, and 112 are preferably PMOS transistors, as is shown in FIG. 1. The signal-in line 114 is pre-charged by a source voltage when a memory cell is to be programmed by switching on a pre-charge module 116. A sense amplifier 130, which is coupled to a node 119 located on the signal-line 114, can be used to determine a state of a selected memory cell during a read process. The sense amplifier 13 is further connected to a latch module 132 which is triggered by a latch-enable signal to store the sensed data from the sense amplifier 130 to generate a final output.

It is understood that the read speed for a memory largely depends on how fast the latch module can read a "low" state of the memory cell. That is, if the latch-enable signal can be activated sooner, the read speed can be improved. In order to shorten the read speed for a memory cell, a discharge subsystem (e.g., a set of discharge modules) implemented at the bit-lines to help discharge the bit-lines before the latch 132 is triggered. The discharge modules are preferred to be of a similar type of transistors used for the memory cells in order for discharge time to be easily calculated or predicted. For this example, a set of NMOS transistors 120, 122, and 124 are used for the discharge subsystem, and the NMOS transistors 120, 122, and 124 are controlled by a discharge control signal provided by a discharge control line 126.

By discharging the bit-lines before the latch is triggered, the bit-lines can be discharged quickly, thereby allowing earlier reading for the low state. This low state is typically a state that requires the longest time to read since the latch is not designed to trigger until the bit-lines leak to a certain voltage level. By discharging the bit-lines, the read cycle can be sped up, thereby improving the read speed. In addition, a better gain can also be provided for the read margins for the ROM design. It is noteworthy that even with the accelerated discharges of the bit-lines, there are still enough read margins for the reading of the high states.

When the memory cell 102 is to be read for its state, a low control signal will be applied to the gate of the pre-charge module 116, turning it on to allow a supply voltage to pre-charge the signal-in line 114. When the signal-in line 114 is charged, the module 116 is turned off and the module 108 will be turned on to provide the bit-line 104 with a necessary current. The word-line 106 will apply a necessary signal to select a row of memory cells where the memory cell 102 is located. With the charged bit-line 104 and a high signal at the word-line 106, the memory cell 102 is selected, and the sense amplifier can read the state of the memory cell 102. A pre-programmed voltage threshold level is used to determine a state of the memory cell 102, either high or low. Note that the read signal will continue to leak and once it reaches the read margin for the low state, the discharge control line 126 will provide a necessary signal to turn on the NMOS transistor 120 to discharge the bit-line 104. It is also noted that a latch enable signal is used for recording the read data at the sense amplifier during the discharge process to provide the state of the selected memory cell 102.

Figure 2:
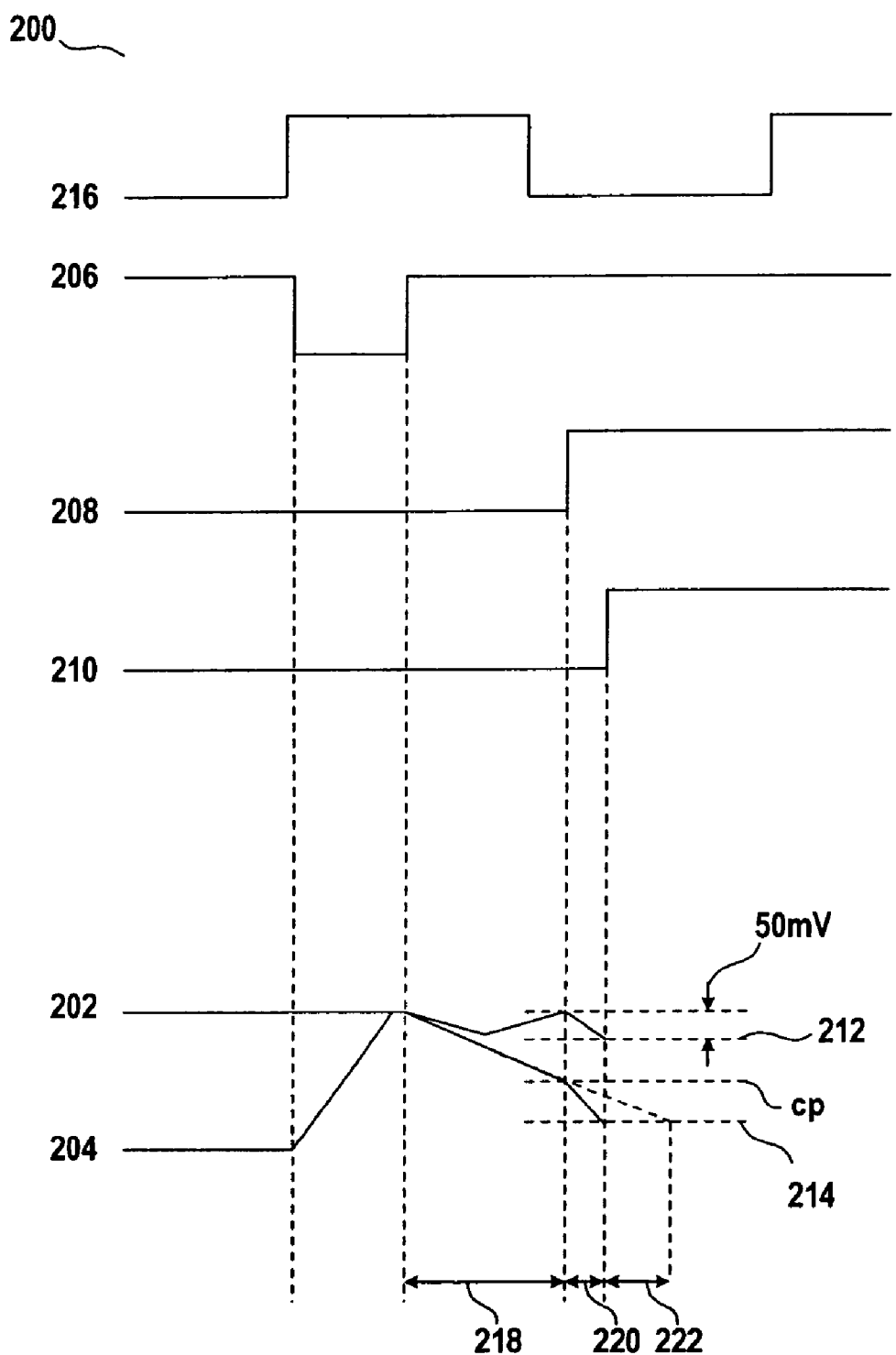
FIG. 2 illustrates a timing diagram of input signals for the circuit shown in FIG. 1.

A timing diagram 200 is provided in FIG. 2 to show the timing of all input signals for the circuit diagram 100. The timing diagram also demonstrates how the read speed is increased by showing the signals at the signal-in line 114.

To further illustrate, two sense input signals 202 and 204 at the node 119 of FIG. 1 are superimposed together in FIG. 2. It is understood that these two signals can not be simultaneously provided to the sense amplifier. The sense input signal 202 represents a signal at the signal-in line when a selected memory cell is at a high state, whereas the signal input signal 204 occurs when the selected memory cell is at a low state. A pre-charge signal 206 is the control signal controlling the gate of and a discharge module 116, and a discharge signal 208 is the control signal appears on signal line 126 controlling the gates of the discharge modules 120–124. Both the discharge and pre-charge signals have effects on the behavior of the sense input signals 202 and 204.

When the pre-charge signal 206 is switched from high to low, the module 116 in FIG. 1 is turned on to charge up the signal-in line 114, thereby causing the sense input signal 204 at node 119 to charge up high. When the pre-charge signal 206 is switched back from low to high, both the sense input signals 202 and 204 will begin to slop down due to leakage. For the sense input signal 202 that represents the signal at the signal-in line 114 of FIG. 1, when the selected memory cell is at the high state, the signal will rise back up after some leakage. After a certain period of time, the discharge signal 208 will be switched high to turn on the NMOS transistors 120, 122, and 124 to allow the sense input signals 202 or 204 to be discharged down to zero. After a predetermined time period, the latch-enable signal 210 will be switched high to trigger the latch module to store and output the sensed data.

When the sense amplifier senses the output from the memory cell, a set of read-margins 212 and 214 are pre-programmed so the sense amplifier can determine if the selected memory cell is at the high or low state. In the preferred embodiment, the high and low read-margins 212 and 214 are programmed so that a signal higher than the high read-margin 212 is deemed as a high state and any thing below the low read-margin 214 is deemed as a low state.

In this example, the sense input signal 202 is around the high read-margin 212, which is lower than the voltage level of the same signal when the discharge signal was initially triggered, when the latch-enable signal 210 is switched high. Similarly, the sense input signal 204 is at the low read-margin 214 when the latch-enable signal 210 is switched high. A dash line marked as "cp" only indicates that roughly a midpoint between the two read-margins. Note that a clock signal 216 is a timing signal for this system, and the input signals such as the pre-charge signal 206 and the discharge signal 208 are both synchronized by the timing of the clock signal 216.

Within a time margin 218, the sense input signals 202 and 204 demonstrates the rate of leakage for the voltage of the sense input signals 202 and 204 when the pre-charge signal 206 is switched back from low to high after the bit-lines are charged. A length of time between when the discharge signal 208 is switched high and when the latch enable signal 210 is switched high is shown within a time margin 220. The time margin 220 is also the length of time required for a bit-line to be discharged to reach the high or low read-margin 212 or 214. A time margin 222 shows the extra time delay that would have occurred for the sense input signal 204 if the bit-lines had not been discharged. The present invention eliminates the need for the latch module to wait for the additional time margin 222 so that the read speed is shortened. On the other hand, the time margin 220 is controlled and predetermined so that a high state of the memory cell is not read as a low state. It is understood that the access time of the memory device is related to the sum of the time margins 218 and 220.

The discharge subsystem, including the NMOS transistors 120, 122, and 124, speeds up the read process since the sense input signals 202 and 204 drop more quickly. By doing so, access time for the ROM circuit design is shortened and the timing margins for reading high and reading low are optimized. With more read margin, a higher yield may also be achieved. Table I below also illustrates the result of an improved memory device designed according to one embodiment of the present invention with the comparison to a similar conventional memory device. The memory device is assumed to have 2 M bits and 1024 bitlines.

TABLE I

|  | Access Time | Low Read-Margin | High Read-Margin |
|---|---|---|---|
| Conventional Device | 4.8 ns | 100 mV | 417 mV |
| Improved Device | 4.1 ns | 100 mV | 367 mV |

As it can be seen by the comparison, the access time is shortened from 4.8 ns to 4.1 ns, i.e., a net 0.7 ns improvement. In addition, the high read-margin has been reduced from 417 mV to 367 mV, which is still much larger than low read-margin.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A memory system comprising:
one or more memory cells;
at least one bit-line discharge subsystem having one or more discharge modules, each discharge module coupled to a bit-line connecting to the one or more memory cells for discharging a voltage level of the bit-line upon a triggering of a discharge control signal;
at least one sense amplifier coupled to the bit-line for determining data stored in a selected memory cell; and
at least one latch module for storing the determined data from the sense amplifier upon a triggering of a latch enable signal,
wherein the discharge control signal is triggered prior to the triggering of the latch enable signal by a predetermined time margin so that the voltage level of the bit-line is discharged to reach a high or low read margin for allowing an accelerated reading of the data.

2. The system of claim 1 further comprising a pre-charge module for charging a signal-in line coupled to the bit-line, thereby charging the bit-line.

3. The system of claim 1 further comprising a bit-line selection module for connecting the sense amplifier to a selected bit-line to access the selected memory cell.

4. The system of claim 1 wherein each of the discharge module is a transistor for discharging the voltage level of the bit-line when the discharge control signal is applied to its gate.

5. The system of claim 4 wherein the transistor is an NMOS transistor.

6. A memory system comprising:
one or more memory cells;
at least one bit-line discharge subsystem having one or more discharge modules, each discharge module coupled to a bit-line connecting to the one or more memory cells for discharging a voltage level of the bit-line upon a triggering of a discharge control signal;
at least one sense amplifier coupled to the bit-line for determining data stored in a selected memory cell; and
at least one latch module for storing the determined data from the sense amplifier upon a triggering of a latch enable signal,
wherein the discharge control signal is triggered prior to the triggering of the latch enable signal so that the voltage level of the bit-line is discharged for allowing an accelerated reading of the data, and
wherein a time margin between the triggering of the discharging control signal and the triggering of the latch enable signal is programmed so that a high state of the memory cell is not misread.

7. A memory system comprising:
one or more memory cells;
at least one bit-line discharge subsystem having one or more discharge modules, each discharge module coupled to a bit-line connecting to the one or more memory cells for discharging a voltage level of the bit-line upon a triggering of a discharge control signal;
at least one sense amplifier coupled to the bit-line for determining data stored in a selected memory cell; and
at least one latch module for storing the determined data from the sense amplifier upon a triggering of a latch enable signal, wherein the discharge control signal is triggered prior to the triggering of the latch enable signal so that the voltage level of the bit-line is discharged for allowing an accelerated reading of the data, and
wherein a time margin between the triggering of the discharging control signal and the triggering of the latch enable signal is shortened for determining a low state of the memory cell due to the discharging.

8. A read-only-memory system comprising:
one or more memory cells;
at least one bit-line discharge subsystem having one or more discharge modules, each discharge module coupled to a bit-line connecting to one or more memory cells for discharging a voltage level of the bit-line upon a triggering of a discharge control signal;
at least one sense amplifier coupled to the bit-line for determining data stored in a selected memory cell;
at least one latch module for storing the determined data from the sense amplifier upon a triggering of a latch enable signal,
wherein the discharge control signal is triggered prior to the triggering of the latch enable signal by a predetermined time margin so that the voltage level of the bit-line is discharged to reach a high or low read margin for allowing an accelerated reading of the data.

9. The system of claim 8 further comprising a pre-charge module for charging a signal-in line coupled to the bit-line, thereby charging the bit-line.

10. The system of claim 8 further comprising a bit-line selection module for connecting the sense amplifier to a selected bit-line to access the selected memory cell.

11. The system of claim 8 wherein the discharge module is a transistor for discharging the voltage level of the bit-line when the discharge control signal is applied to its gate.

12. A read-only-memory system comprising:
one or more memory cells;
at least one bit-line discharge subsystem having one or more discharge modules, each discharge module coupled to a bit-line connecting to one or more memory cells for discharging a voltage level of the bit-line upon a triggering of a discharge control signal;
at least one sense amplifier coupled to the bit-line for determining data stored in a selected memory cell;
at least one latch module for storing the determined data from the sense amplifier upon a triggering of a latch enable signal,
wherein the discharge control signal is triggered prior to the triggering of the latch enable signal so that the voltage level of the bit-line is discharged for allowing an accelerated reading of the data, and
wherein a time margin between the triggering of the discharging control signal and the triggering of the latch enable signal is programmed so that a high state of the memory cell is not misread.

13. A read-only-memory system comprising:
one or more memory cells;
at least one bit-line discharge subsystem having one or more discharge modules, each discharge module coupled to a bit-line connecting to one or more memory cells for discharging a voltage level of the bit-line upon a triggering of a discharge control signal;
at least one sense amplifier coupled to the bit-line for determining data stored in a selected memory cell;

at least one latch module for storing the determined data from the sense amplifier upon a triggering of a latch enable signal, wherein the discharge control signal is triggered prior to the triggering of the latch enable signal so that the voltage level of the bit-line is discharged for allowing an accelerated reading of the data, and wherein a time margin between the triggering of the discharging control signal and the triggering of the latch enable signal is shortened for determining a low state of the memory cell due to the discharging.

14. A read-only-memory system comprising:

one or more memory cells;

at least one bit-line discharge subsystem having one or more discharge modules, each discharge module coupled to a bit-line connecting to one or more memory cells for discharging a voltage level of the bit-line upon a triggering of a discharge control signal;

at least one sense amplifier coupled to the bit-line for determining data stored in a selected memory cell;

at least one bit-line selection module for connecting a selected bit-line the sense amplifier; and at least one latch module for storing the determined data from the sense amplifier upon a triggering of a latch enable signal, wherein the discharge control signal is triggered prior to the triggering of the latch enable signal by a predetermined time margin so that the voltage level of the bit-line is discharged to reach a high or low read margin for allowing an accelerated reading of the data.

15. The system of claim 14 further comprising a pre-charge module for charging a signal-in line coupled to the bit-line, thereby charging the bit-line.

16. The system of claim 14 the discharge module is a transistor for discharging the voltage level of the bit-line when the discharge control signal is applied to its gate.

17. A read-only-memory system comprising:

one or more memory cells;

at least one bit-line discharge subsystem having one or more discharge modules, each discharge module coupled to a bit-line connecting to one or more memory cells for discharge a voltage level of the bit-line upon a triggering of a discharge control signal;

at least one sense amplifier coupled to the bit-line for determining data stored in a selected memory cell;

at least one bit-line selection module for connecting a selected bit-line the sense amplifier; and at least one latch module for storing the determined data from the sense amplifier upon a triggering of a latch enable signal, wherein the discharge control signal is triggered prior to the triggering of the latch enable signal so that the voltage level of the bit-line is discharged for allowing an accelerated reading of the data, and wherein a time margin between the triggering of the discharging control signal and the triggering of the latch enable signal is programmed so that a high state of the memory cell is not misread.

18. A read-only-memory system comprising:

one or more memory cells;

at least one bit-line discharge subsystem having one or more discharge modules, each discharge module coupled to a bit-line connecting to one or more memory cells for discharging a voltage level of the bit-line upon a triggering of a discharge control signal;

at least one sense amplifier coupled to the bit-line for determining data stored in a selected memory cell;

at least one bit-line selection module for connecting a selected bit-line the sense amplifier; and at least one latch module for storing the determined data from the sense amplifier upon a triggering of a latch enable signal, wherein the discharge control signal is triggered prior to the triggering of the latch enable signal so that the voltage level of the bit-line is discharged for allowing an accelerated reading of the data, and wherein a time margin between the triggering of the discharging control signal and the triggering of the latch enable signal is shortened for determining a low state of the memory cell due to the discharging.

* * * * *